(12) United States Patent
Alam et al.

(10) Patent No.: US 10,395,699 B2
(45) Date of Patent: *Aug. 27, 2019

(54) MEMORY DEVICE WITH SHARED AMPLIFIER CIRCUITRY

(71) Applicant: Everspin Technologies, Inc., Chandler, AZ (US)

(72) Inventors: Syed M. Alam, Austin, TX (US); Thomas Andre, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 38 days.

This patent is subject to a terminal disclaimer.

(21) Appl. No.: 14/496,984

(22) Filed: Sep. 25, 2014

(65) Prior Publication Data
US 2016/0093341 A1 Mar. 31, 2016

(51) Int. Cl.
| G11C 7/12 | (2006.01) |
| G11C 7/06 | (2006.01) |
| G11C 5/06 | (2006.01) |

(52) U.S. Cl.
CPC .............. *G11C 7/12* (2013.01); *G11C 5/063* (2013.01); *G11C 7/062* (2013.01)

(58) Field of Classification Search
CPC ........................................................ G11C 7/12
USPC ................... 365/63, 189.14, 230.03, 230.04
See application file for complete search history.

(56) References Cited

U.S. PATENT DOCUMENTS

| 8,923,041 | B2 * | 12/2014 | Andre | G11C 11/1673 365/158 |
| 8,929,132 | B2 * | 1/2015 | Alam | G11C 11/16 365/158 |
| 9,336,848 | B2 * | 5/2016 | Alam | G11C 11/1675 |
| 9,697,879 | B2 * | 7/2017 | Alam | G11C 11/1673 |
| 9,697,880 | B2 * | 7/2017 | Andre | G11C 11/1675 |
| 9,847,116 | B2 * | 12/2017 | Gogl | G11C 11/1675 |
| 2005/0243622 | A1 * | 11/2005 | Omoto | G11C 7/062 365/203 |
| 2008/0130379 | A1 * | 6/2008 | Ohsawa | G11C 8/08 365/189.11 |
| 2010/0284209 | A1 * | 11/2010 | Kim | G11C 8/14 365/80 |
| 2013/0128657 | A1 * | 5/2013 | Alam | G11C 11/1673 365/158 |
| 2013/0128658 | A1 * | 5/2013 | Alam | G11C 11/16 365/158 |
| 2013/0155763 | A1 * | 6/2013 | Alam | G11C 11/165 365/158 |
| 2013/0272060 | A1 | 10/2013 | Andre et al. | |
| 2014/0226396 | A1 * | 8/2014 | Subramanian | G11C 7/24 365/158 |

(Continued)

*Primary Examiner* — Amir Zarabian
*Assistant Examiner* — Jay W. Radke
(74) *Attorney, Agent, or Firm* — Bookoff McAndrews, PLLC (57) ABSTRACT

In some examples, a memory device may have at least a first and a second memory array. In some cases, a portion of the bit cells of the first memory array may be coupled to first PMOS-follower circuitry and to second PMOS-follower circuitry. A portion of the bit cells of the second memory array may also be coupled to the second PMOS-follower circuitry and to third PMOS-follower circuitry. Additionally, in some cases, the portions of bit cells of both the first memory array and the second memory array may be coupled to shared preamplifier circuitry.

12 Claims, 6 Drawing Sheets

(56) References Cited

U.S. PATENT DOCUMENTS

| | | | | |
|---|---|---|---|---|
| 2014/0230079 A1* | 8/2014 | Alam | ................. | G06F 21/78 |
| | | | | 726/34 |
| 2015/0071020 A1* | 3/2015 | Javanifard | ............... | G11C 8/10 |
| | | | | 365/230.03 |
| 2016/0093341 A1* | 3/2016 | Alam | ................. | G11C 7/062 |
| | | | | 365/63 |
| 2016/0099037 A1* | 4/2016 | Alam | ................. | G11C 11/1673 |
| | | | | 365/158 |
| 2016/0099038 A1* | 4/2016 | Alam | ................. | G11C 11/1673 |
| | | | | 365/158 |
| 2016/0307615 A1* | 10/2016 | Andre | ................. | G11C 11/1673 |
| 2017/0092347 A1* | 3/2017 | Gogl | ................. | G11C 11/1675 |
| 2017/0125079 A1* | 5/2017 | Alam | ................. | G11C 11/1673 |
| 2017/0301384 A1* | 10/2017 | Andre | ................. | G11C 11/1673 |

\* cited by examiner

MEMORY DEVICE WITH SHARED AMPLIFIER CIRCUITRY

BACKGROUND

In the electronic industry of today, there is a constant drive to reduce the size of electronic devices, increase battery life, and improve performance. In some cases, reducing the size, increasing the battery life, and improving performance of the electronic device is related to reducing the size and power consumption of individual components of the electronic device, such as the memory device. For example, in memory device architectures, such as dynamic random access memories (DRAM) devices and magnetic random access memories (MRAM), there is a consistent effort to increase memory storage density and access speeds, while reducing overall power consumption and leakage.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

This disclosure includes techniques and implementations to reduce the overall size and number of circuits associated with memory devices, such as magnetic random access memories (MRAMs) devices, while maintaining similar storage capacity and power consumption levels. For example, in some cases, reducing the size of the memory device may be achieved by increasing the density or number of bit cells associated with each memory array of the memory device. Unfortunately, as the density of each memory array is increased the length of the bit lines and source lines used to select the bit cells typically increases. When the length of the bit lines and source lines are increased, the average power necessary to select the bit cells within the array increases correspondingly, thereby increasing the power consumption of the overall memory device.

Alternatively, in other cases, the power consumption of the memory device may be reduced by decreasing the density or number of bit cells associated with each memory array of the memory device. For example, reducing the density or number of bit cells in each memory array reduces the length of the bit lines and source lines, thereby reducing the average power consumption associated with selecting individual bit cells of the arrays resulting in reduced overall power consumption of the memory device. However, to maintain storage capacity on the memory device while reducing the density of the memory arrays results in an increase of the total number of arrays. In some types of memory devices, some of the circuitry associated with accessing the memory arrays are replicated or duplicated for each individual array. Thus, by increasing the number of arrays to accommodate decreased density in the memory arrays, the number of replicated or duplicated circuits are also increased and the overall size of the memory device is increased correspondingly.

Implementations are described herein, to reduce the length of the bit lines and source lines, while reducing the number of replicated or duplicated components and circuits within a memory device. In one example, the memory arrays may be configured to share at least some circuits associated with accessing (reading and writing) the bit cells. For instance, in some implementations, each memory array may include Positive-Channel Metal Oxide Semiconductor (PMOS)-follower circuitry and column selection circuitry arranged at both the ends of the array. By arranging the PMOS-follower circuitry and the column selection circuitry at both ends of the memory array, the effective length of the connected lines, such as source lines, may be reduced, as a first portion of the bit cells in the array are accessed via the column selection circuitry arranged at one end of the memory array and a second portion of the bit cells in the memory array may be accessed via the column selection circuitry arranged at the other end of the memory array.

In other examples, the memory arrays may be arranged in pairs that share PMOS-follower (PMOS-follower) circuitry and preamplifier circuitry. For example, a memory device may include a first memory array arranged adjacent to a second memory array. In this particular example, the first memory array may have column selection circuitry configured below the first memory array and the second memory array may have column selection circuitry configured above the second memory array. In this manner, common PMOS-follower circuitry may be coupled between the column selection circuitry of both the first and second memory arrays and, thus, configured to drive the lines, such as bit line or source line, of both the first memory array and the second memory array. Similarly, preamplifier circuitry may also be arranged between the column selection circuitry of both the first memory array and the second memory array and configured to drive a line, such as the source line, of both the first memory array and the second memory array.

In other implementations, pairs of memory arrays may be configured to share at least one of the PMOS-follower circuits, while multiple pairs of memory arrays may share a common preamplifier circuit. For instance, in an example having four memory arrays, the first memory array and the second memory array may be configured to share a first common PMOS-follower. The second memory array and the third memory array may be configured to share a second PMOS-follower. The third memory array and the fourth memory array may be configured to share a third PMOS-follower.

In this example, the first memory array may have a fourth PMOS-follower arranged opposite the first PMOS-follower and the fourth memory array may have a fifth PMOS-follower arranged opposite the third PMOS-follower, such that each memory array has a PMOS-follower arranged at both ends. In some examples, the fourth and fifth PMOS-followers may be shared with additional memory arrays of the memory device. In this implementation, the memory device may also include preamplifier circuitry positioned an approximately equal distance from each of the four memory arrays (e.g., positioned or routed such that a length of time associated with a bias voltage generated by the preamplifier circuitry reaching each of the four memory arrays is substantially identical).

Figure 1:
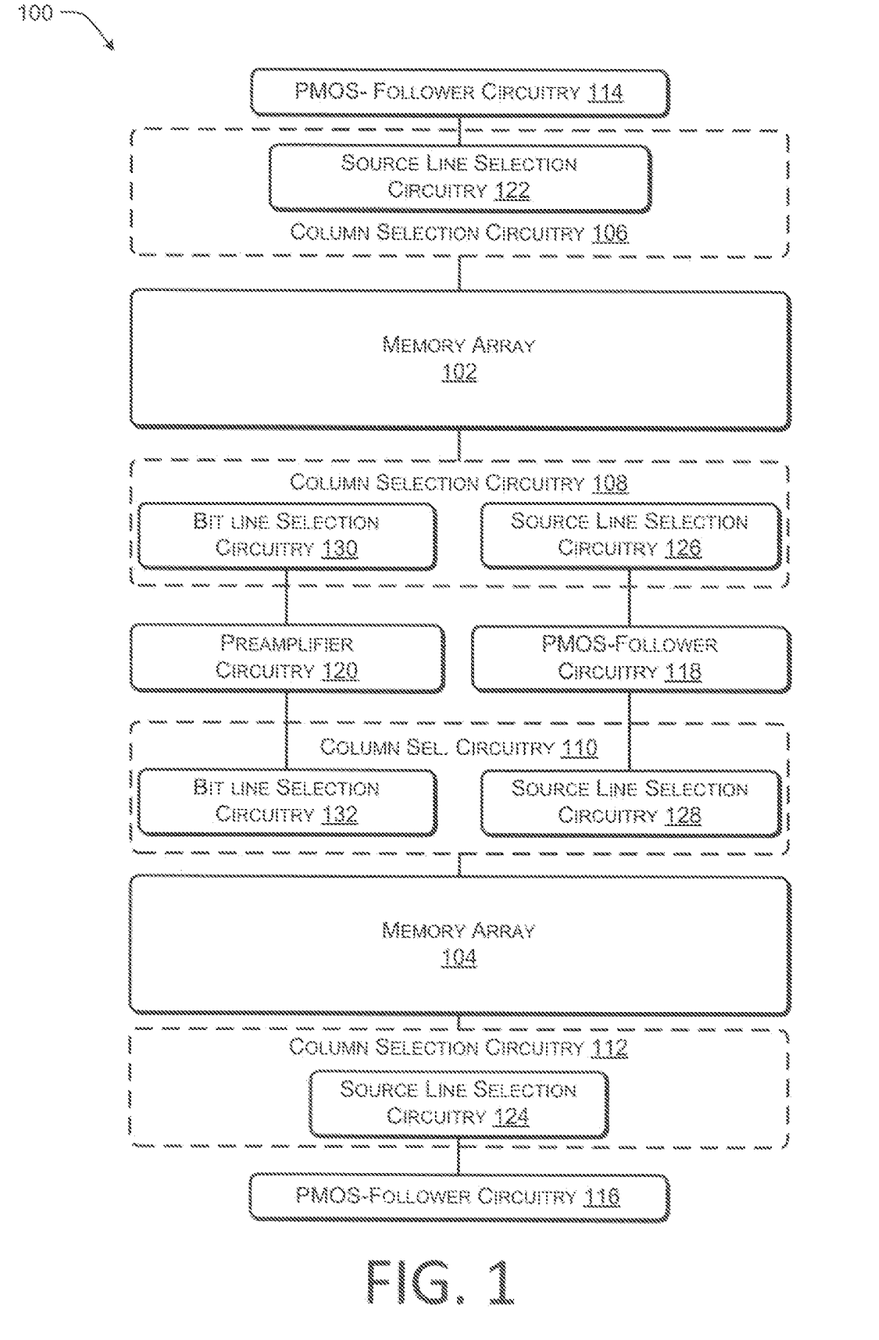
FIG. 1 illustrates an example architecture including select components of a memory device according to some implementations.

FIG. 1 illustrates an example architecture of select components of a memory device 100 according to some implementations. The memory device 100 may be an example of tangible non-transitory computer storage media and may include volatile and nonvolatile memory and/or removable and non-removable media implemented in any type of technology for storage of information such as computer-readable instructions or modules, data structures, program modules or other data. Such computer-readable media may include, but is not limited to, RAM, ROM, EEPROM, flash memory or other computer-readable media technology, solid state storage, magnetic disk storage, RAID storage systems, storage arrays, network attached storage, storage area networks, cloud storage, or any other medium that can be used to store information and which can be accessed by a processor.

The memory device 100 includes a memory array 102 and a memory array 104. In the illustrated example, column selection circuitry 106 may be arranged at one end (e.g., the top) of the memory array 102 and column selection circuitry 108 may be arranged at the other end (e.g., the bottom) of the memory array 102. The column selection circuitry 110 may be arranged at one end (e.g., the top) of the memory array 104 and column selection circuitry 112 may be arranged at the other end (e.g., the bottom) of the memory array 104. In the present example, a PMOS-follower circuitry may be coupled to each of the column selection circuits 106-112. For example, PMOS-follower circuitry 114 may be coupled to the column selection circuitry 106, PMOS-follower circuitry 116 may be coupled to the column selection circuitry 112, and PMOS-follower circuitry 118 shared by the first memory array 102 and the second memory array 104 may be coupled to both the column selection circuitry 108 and the column selection circuitry 110. In addition to the shared PMOS-follower circuitry 118, the memory arrays 102 and 104 also share preamplifier circuitry 120 that may be coupled to the column selection circuitry 108 and the column selection circuitry 110.

In some cases, the PMOS-follower circuits 114, 116, 118 may be coupled to source line selection circuits of the column selection circuits 106, 108, 110, 112 and the preamplifier circuitry 120 may be coupled to the bit line selection circuits of the column selection circuits 108 and 110. For example, the PMOS-follower circuitry 114 may be coupled to source line selection circuitry 122, the PMOS-follower circuitry 116 may be coupled to source line selection circuitry 124, and the PMOS-follower circuitry 118 may be coupled to both the source line selection circuitry 126 and the source line selection circuitry 128. Similarly, the preamplifier circuitry 120 may be coupled to both the bit line selection circuitry 130 and the bit line selection circuitry 132.

In one example, the memory arrays 102 and 104 each include a plurality of bit cells arranged in rows and columns. When bit cells of either array 102 or 104 are accessed, word line circuitry (not shown) associated with each memory array 102 and 104 drives a bias voltage over particular word line or row of the memory arrays 102 and 104. Meanwhile, at least one of the PMOS-follower circuits 114, 116, 118 drives a bias voltage along sources lines selected by at least one of the source line selection circuitry 122, 124, 126, and 128. When a word line, the source line, and the bit line of a particular bit cell are activated, the bit cell generates a voltage which may be detected and evaluated by the preamplifier circuitry 120 along bit lines selected by either the bit line selection circuitry 130 or 132, for example via a read operation. The preamplifier circuitry 120 may compare the voltage detected for each bit cell with a sample or reference voltage to output the data as a digital signal (e.g., a one or zero) based at least in part on the results of the comparison.

For example, if an external source issues a command to the memory device 100 to access data stored in the memory array 102, a word line associated with the selected row of the memory array 102 being accessed may be biased by the word line circuitry (not shown) and the source lines associated with the columns being accessed are biased by the PMOS-follower circuitry 114 and 118. For example, column selection devices of the source line selection circuitry 122 and 126 associated with the columns of the first memory array 102 being accessed may be activated, while column selection devices of the source line selection circuitry 122 and 126 associated with the columns of the memory array 102 not being accessed may be de-activated. In this manner, the bias voltage (e.g., a read or write voltage) generated by the PMOS-follower circuitry 114 and 118 may be applied only to the columns having data being read from the memory array 102.

Similarly, column selection devices of the bit line selection circuitry 130 associated with the columns of the memory array 102 being accessed may be activated, while column selection devices of the bit line selection circuitry 130 associated with the columns of the memory array 102 not being accessed may be de-activated. In this manner, the preamplifier circuitry 120 may be able to detect voltages generated by the bit cells whose word lines and sources lines are biased and compare the detected voltages with sample or reference voltages in order to read the data from the memory array 102.

In another example, if an external source issues a command to the memory device 100 to access data stored in the memory array 104. A word line associated with the selected row of the memory array 104 being accessed may be biased by the word line circuitry and the source lines associated with the columns being accessed are biased by the PMOS-follower circuitry 116 and 118. For example, column selection devices of the source line selection circuitry 124 and 128 associated with the columns of the memory array 104 being accessed may be activated, while column selection devices of the source line selection circuitry 124 and 128 associated with the columns of the memory array 104 not being accessed may be de-activated. In this manner, the bias voltage generated by the PMOS-follower circuitry 116 and 118 may be applied only to the columns having data being read from the memory array 104.

Similarly, columns selection devices of the bit line selection circuitry 132 associated with the columns of the memory array 104 being accessed may be activated, while column selection devices of the bit line selection circuitry 132 associated with the columns of the memory array 104 not being accessed may be de-activated. In this manner, the preamplifier circuitry 120 may be able to detect voltage or current levels associated with the bit cells whose word lines and sources lines are biased and compare the detected voltage or current levels with sampled or reference voltage or current levels in order to read the data from the memory array 104.

Thus, in the illustrated example, the memory device 100 may be configured such that memory array 102 and the memory array 104 are able to share the preamplifier circuitry 120 by locating the preamplifier circuitry 120 between the memory array 102 and the memory array 104 and coupling the preamplifier circuitry 120 to both the bit line selection circuitry 130 associated with the array 102 and the bit line selection circuitry 132 associated with the array 104. The number of replicated or duplicated components within the memory device 100 may be reduced as a single preamplifier circuit, the preamplifier circuitry 120, may be utilized by more than one memory array. Thus, as the number of components in the memory device 100 are reduced the overall size of the memory device 100 is likewise reduced.

Additionally, the memory device 100 may be configured such that the first memory array 102 and the memory array 104 are able to share the PMOS-follower circuitry 118 by locating the PMOS-follower circuitry 118 between the memory array 102 and the memory array 104 and coupling the PMOS-follower circuitry 118 to both the source line selection circuitry 126 associated with the memory array 102 and the source line selection circuitry 128 associated with the memory array 104. In this manner, the number of replicated or duplicated components within the memory device 100 may be reduced as PMOS-follower circuitry 118 may be utilized to bias the source lines of the memory array 102 and the memory array 104. Thus, as the number of components in the memory device 100 are reduced, the overall size of the memory device 100 is likewise reduced.

Figure 2:
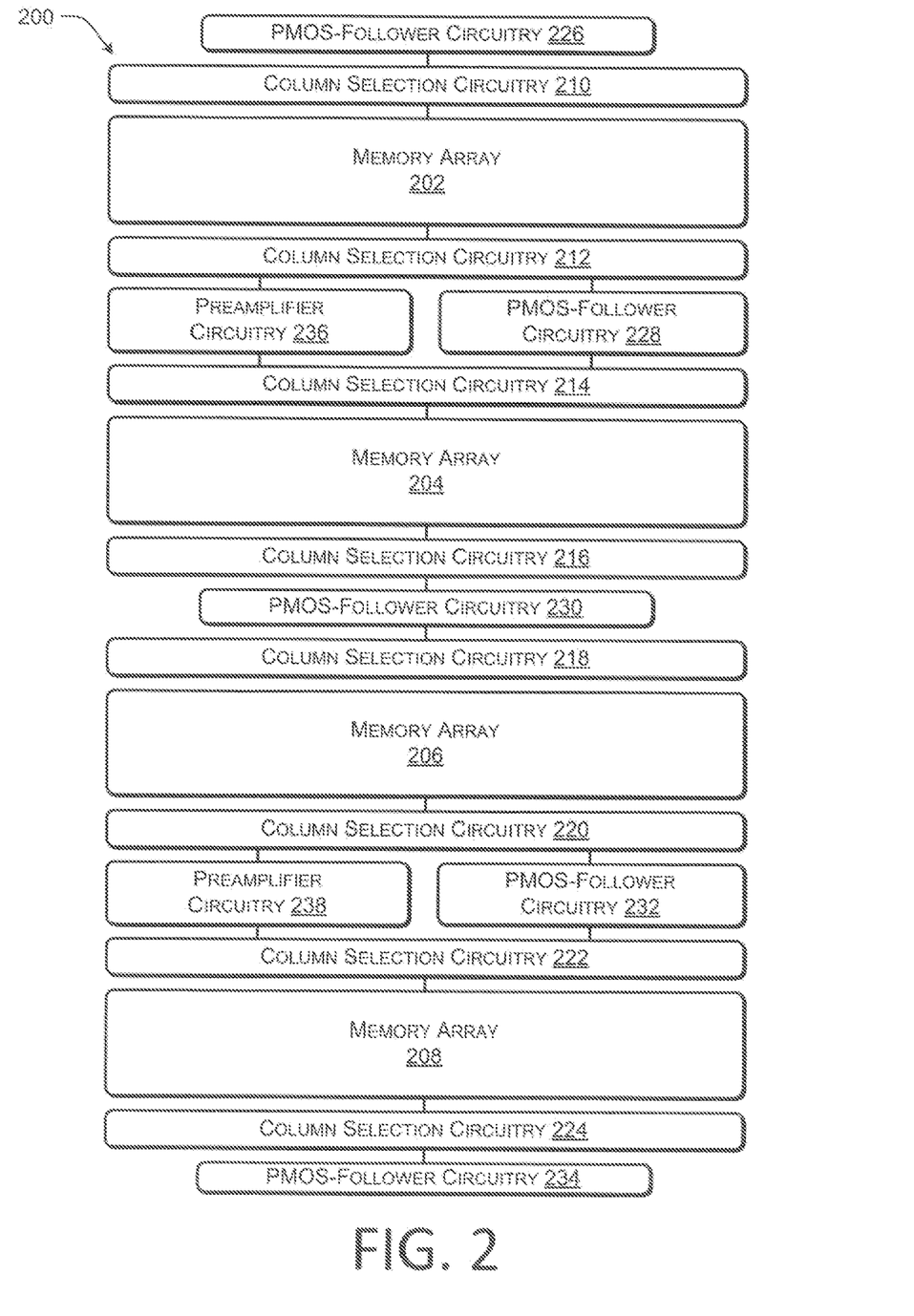
FIG. 2 illustrates an example architecture including select components of a memory device according to some implementations.

FIG. 1 illustrates an example arrangement of the memory device 100 having two arrays 102 and 104 sharing PMOS-follower circuitry 118 and preamplifier circuitry 120. FIG. 2 described below illustrates a memory device 200 having additional memory arrays 202, 204, 206, and 208 utilizing shared PMOS-follower circuitry and preamplifier circuitry.

FIG. 2 illustrates an example architecture of select components of a memory device 200 according to some implementations. The memory device 200 may include a first memory array 202, a second memory array 204, a third memory array 206, and a fourth memory array 208. In the illustrated example, column selection circuitry may be arranged at both ends of each of the memory array 202-208. For example, the column selection circuitry 210 may be arranged at a first end of the memory array 202 and column selection circuitry 212 may be arranged at the second end opposite the first end of the memory array 202. Column selection circuitry 214 may be arranged at the first end of the memory array 204 and column selection circuitry 216 may be arranged at the second end of the memory array 204. Column selection circuitry 218 may be arranged at the first end of the memory array 206 and column selection circuitry 220 may be arranged at the second end of the memory array 206. Column selection circuitry 222 may be arranged at the first end of the memory array 208 and column selection circuitry 224 may be arranged at the second end of the memory array 208.

In one example, the column selection circuitry 210, 212, 214, 216, 218, 220, 222, 224 may be configured to activate and de-activate column selection devices associated with particular columns of the memory arrays 202, 204, 206, 208. For example, column selection circuitry 212 may include a plurality of column selection devices associated with the bit lines of the columns of the memory array 202 and a plurality of column selection devices associated with the source lines of memory array 202.

In the present example, PMOS-follower circuitry may be coupled to each of the column selection circuitry 210, 212, 214, 216, 218, 220, 222, 224. For example, PMOS-follower circuitry 226 may be coupled to the column selection circuitry 210, PMOS-follower circuitry 228 shared between memory arrays 202 and 204 may be coupled to both the column selection circuitry 212 and the column selection circuitry 214, PMOS-follower circuitry 230 shared between memory arrays 204 and 206 may be coupled to the column selection circuitry 216 and the column selection circuitry 218, PMOS-follower circuitry 232 shared between memory arrays 206 and 208 may be coupled to the column selection circuitry 220 and the column selection circuitry 222, and PMOS-follower circuitry 234 may be coupled to column selection circuitry 224.

Each of the PMOS-follower circuitry 226, 228, 230, 232, 234 are connected to source lines associated with the bit cells to drive a bias voltage over the source lines when the data within the corresponding column may be being accessed. In this manner, each of the memory arrays 202, 204, 206, 208 may be accessed by two PMOS-followers circuits coupled thereto, as such the resistance of the source line is reduced by driving the bias voltage from both sides.

Additionally, in the illustrated example, the PMOS-follower circuitry 228 may be shared by the memory array 202 and the memory array 204, the PMOS-follower circuitry 230 may be shared by the memory array 204 and the memory array 206, and the PMOS-follower circuitry 232 may be shared by the memory array 206 and the memory array 208 resulting in a device architecture with reduced components, thereby resulting in a memory device with reduced the overall size.

In the illustrated example, preamplifier circuitry may be shared between pairs of memory arrays. For example, preamplifier circuitry 236 may be positioned between and shared by the memory array 202 and the memory array 204. For instance, in the illustrated example, the preamplifier circuitry 236 may be coupled to the bit lines of the memory array 202 via the column selection circuitry 212 and to the bit lines of the memory array 204 via the column selection circuitry 214. Likewise, preamplifier circuitry 238 may be positioned between and shared by the memory array 206 and the memory array 208. For instance, in the illustrated example, the preamplifier circuitry 238 may be coupled to the bit lines of the memory array 206 via the column selection circuitry 220 and to the bit lines of the memory array 208 via the column selection circuitry 222.

As described above with respect to FIG. 1, each of the memory arrays 202, 204, 206, 208 include a plurality of bit cells arranged in rows and columns. When bit cells of the memory arrays 202, 204, 206, 208 are accessed, word line circuits (not shown) drive a bias voltage over particular word lines or rows of the memory arrays being accessed, while at least one of the PMOS-follower circuits 226, 228, 230, 232, 234 drives a bias voltage along sources lines of the memory arrays being accessed. When a word line, the bit line, and the source line of a particular bit cell may be activated, current flows through the bit cell which may be detected and evaluated by the preamplifier circuitry corresponding to the memory array being accessed. The preamplifier circuitry 236 or 238 may compare the detected current for each bit cell with a sampled reference current and output the data as a digital signal (e.g., a one or zero) based at least in part on the results of the comparison. In this manner, the number of replicated or duplicated components within the memory device 200 may be reduced as each of the preamplifier circuits 236 and 238 may be configured to read data from multiple memory arrays. Thus, as the number of components in the memory device 200 may be reduced, the overall size of the memory device 200 is likewise reduced.

In the illustrated example, when data stored in the memory array 202 may be accessed, the PMOS-follower circuitry 226 and 228 and the preamplifier circuitry 236 are utilized. Similarly, when data stored in the memory array 204 may be accessed, the PMOS-follower circuitry 228 and 230 and the preamplifier circuitry 236 are utilized. When data stored in the memory array 206 may be accessed, the PMOS-follower circuitry 230 and 232 and the preamplifier circuitry 238 are utilized. When data stored in the memory array 208 may be accessed, the PMOS-follower circuitry 232 and 234 and the preamplifier circuitry 238 are utilized.

Figure 3:
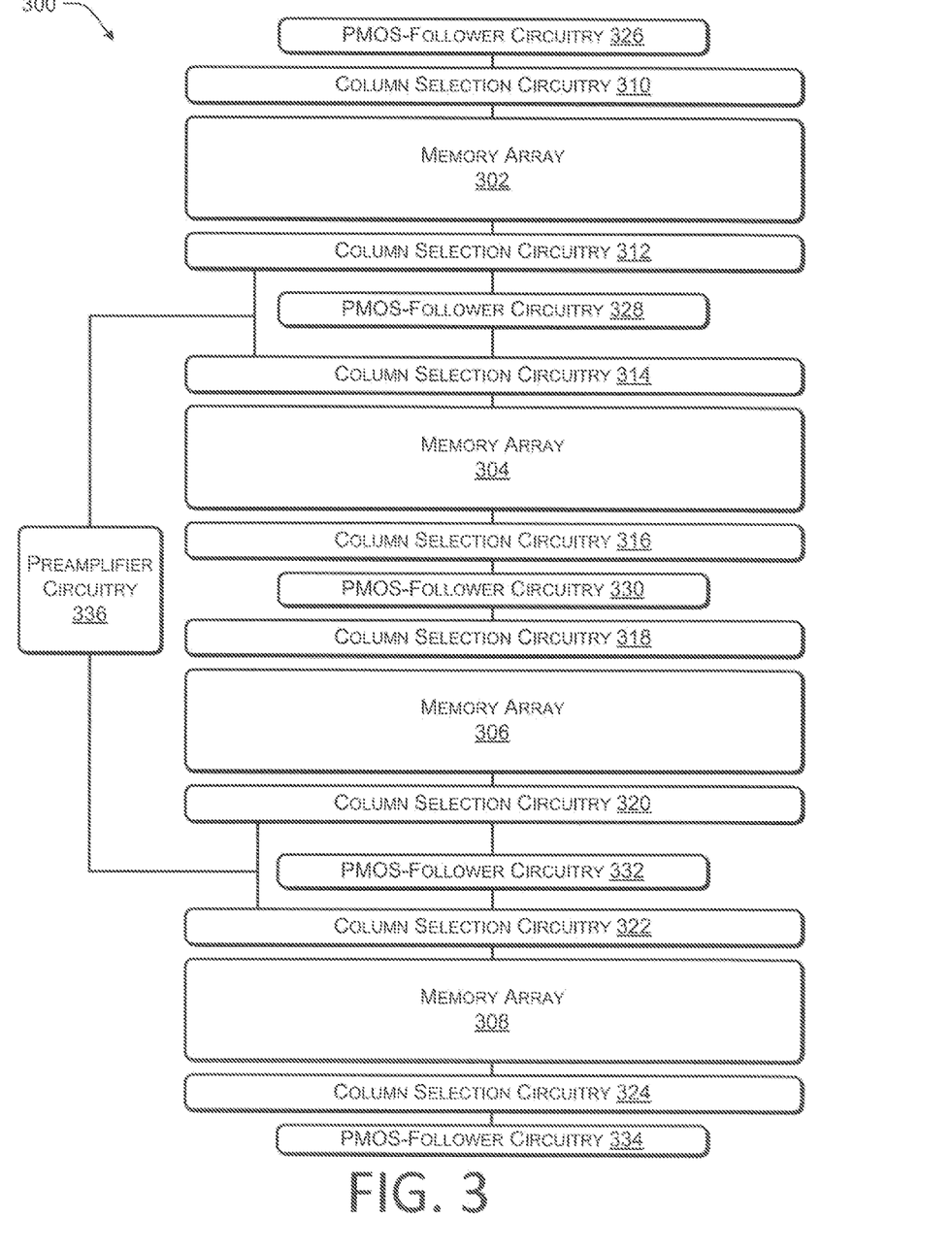
FIG. 3 illustrates an example architecture including select components of a memory device according to some implementations.

FIG. 2 illustrates one example arrangement of the memory device 200 having multiple memory arrays 202, 204, 206, 208 utilizing shared circuitry. It should be understood that memory array 202 and 206 can be accessed concurrently during one access (read or write) while the memory array 204 and 208 can be accessed concurrently during another access. The memory arrays 202 and 204 cannot be accessed at the same time because preamplifier circuitry 236 and PMOS-follower circuitry 228 are shared between both of the memory arrays. Similarly, the memory arrays 206 and 208 cannot be accessed at the same time. FIG. 3 described below illustrates another example arrangement of a memory device 300 having multiple arrays utilizing shared circuitry.

FIG. 3 illustrates an example architecture of select components of a memory device 300 according to some implementations. The memory device 300 includes a first memory array 302, a second memory array 304, a third memory array 306, and a fourth memory array 308. In the illustrated example, column selection circuitry may be arranged at two opposing ends of each memory array 302, 304, 306, 308. For example, the column selection circuitry 310 may be arranged at the top of the memory array 302 and column selection circuitry 312 may be arranged at the bottom of the memory array 302. Column selection circuitry 314 may be arranged at the top of the memory array 304 and column selection circuitry 316 may be arranged at the bottom of the memory array 304. Column selection circuitry 318 may be arranged at the top of the memory array 306 and column selection circuitry 320 may be arranged at the bottom of the memory array 306. Column selection circuitry 322 may be arranged at the top of the memory array 308 and column selection circuitry 324 may be arranged at the bottom of the memory array 308.

In general, the column selection circuitry 310, 312, 314, 316, 318, 320, 320, 324 may be configured to activate and de-activate column selection devices associated with particular columns of the memory arrays 302, 304, 306, 308. For example, column selection circuitry 312 may include a plurality of column selection devices associated with the bit lines of the columns of memory array 302 and a plurality of column selection devices associated with the source lines of memory array 302.

In the present example, PMOS-follower circuitry may be coupled to each of the column selection circuitry 310, 312, 314, 316, 318, 320, 320, 324. For example, a PMOS-follower circuitry 326 may be coupled to the column selection circuitry 310, PMOS-follower circuitry 328 shared between memory arrays 302 and 304 may be coupled to both the column selection circuitry 312 and the column selection circuitry 314, PMOS-follower circuitry 330 shared between memory arrays 304 and 306 may be coupled to the column selection circuitry 316 and the column selection circuitry 318, PMOS-follower circuitry 332 shared between memory arrays 306 and 308 may be coupled to the column selection circuitry 320 and the column selection circuitry 322, and PMOS-follower circuitry 334 may be coupled to column selection circuitry 324. Each of the PMOS-followers 326, 328, 330, 332, 334 are connected to either bit lines or source lines associated with the bit cells of at least one memory array to drive a bias voltage over the bit lines or source lines when the data within the corresponding column being accessed.

In this manner, each of the memory arrays 302-308 may be accessed by two PMOS-follower circuits coupled thereto. Additionally, in the illustrated example, the PMOS-follower circuitry 328 may be shared by the memory array 302 and the memory array 304, the PMOS-follower circuitry 330 may be shared by the memory array 304 and the memory array 306, and the PMOS-follower circuitry 332 may be shared by the memory array 306 and the memory array 308 resulting in a device architecture with reduced components, thereby resulting in a memory device with reduced the overall size.

Unlike FIG. 2 above, the preamplifier circuitry 336 may be shared between each of the memory arrays 302-308 of the memory device 300. In general, the preamplifier circuitry 336 may be coupled to column selection circuitry of each array 302-308 and physically positioned such that the routing or distance between the preamplifier circuitry 336 and each of the memory arrays 302-308 may be substantially identical. For instances, in the illustrated example, the preamplifier circuitry 336 may be coupled to the bit lines of the memory array 302 via the column selection circuitry 312, to the bit lines of the memory arrays 304 via the column selection circuitry 314, to the bit lines of the memory array 306 via the column selection circuitry 320, and to the bit lines of the memory array 308 via the column selection circuitry 322. In this manner, the number of replicated components within the memory device 300 may be reduced as the preamplifier circuitry 336 may be configured to read data from each of the memory arrays 302-308 of the memory device 300. Thus, the number of replicated or duplicated components within the memory device 300 may be reduced and the overall size of the memory device 300 may likewise be reduced, as each memory array 302-308 no longer requires a separate preamplifier circuit.

In some cases, when memory device 300 is accessed, only one row from one of the memory arrays 302, 304, 306, and 308 may be selected for access. Since three of the four memory arrays in memory device 300 are de-activated during an access, power reduction is possible by reducing the capacitance associated with accessed bit cells.

Figure 4:
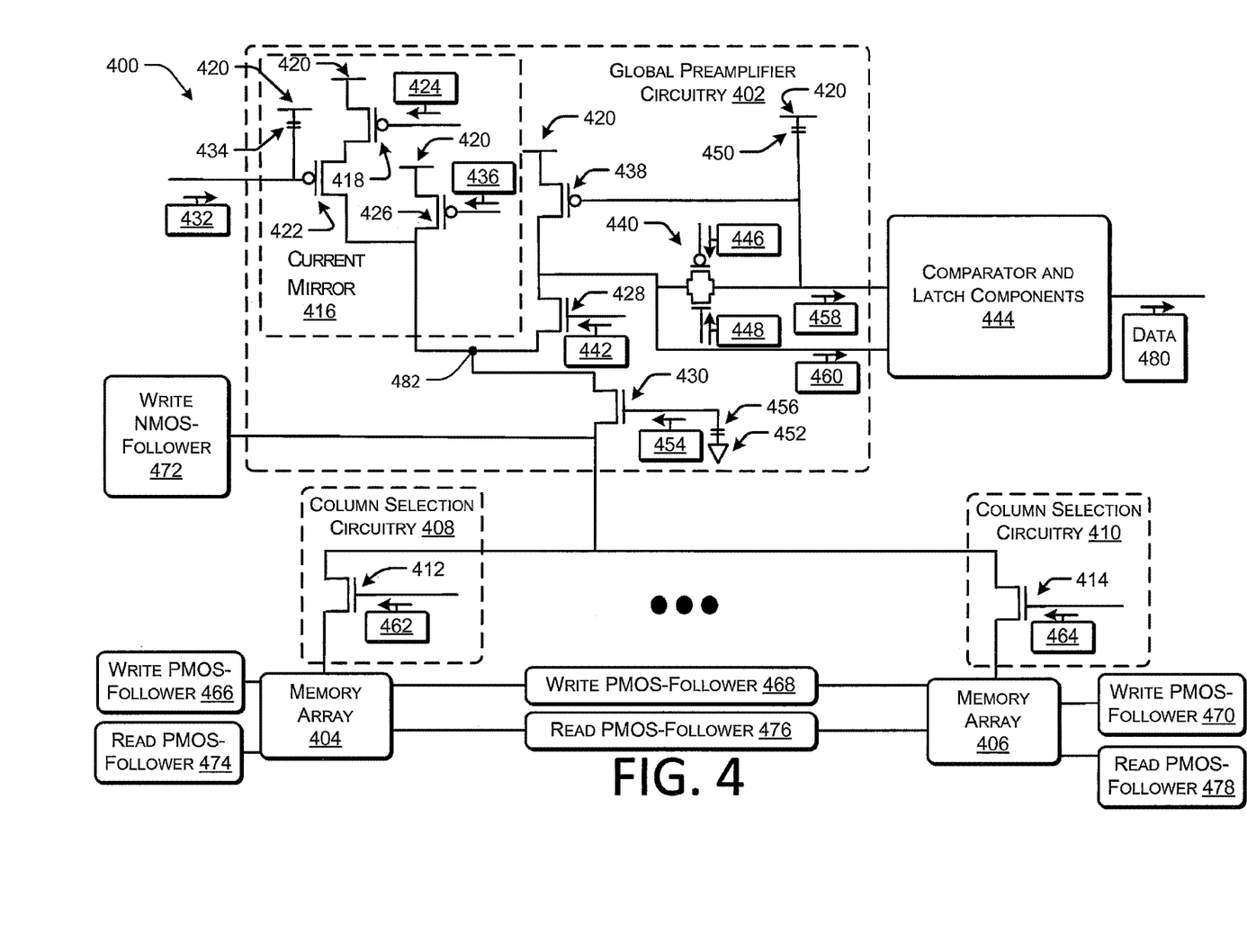
FIG. 4 illustrates a diagram of an example memory device incorporating preamplifier circuitry according to some implementations.

FIG. 4 illustrates a diagram of an example memory device 400 incorporating preamplifier circuitry 402 according to some implementations. In general, the preamplifier circuitry 402 may be coupled to the memory array 404 via column selection circuitry 408 and to the memory array 406 via column selection circuitry 410. For example, in the illustrated example the column selection circuitry 408 includes a column selection device 412 coupled to the memory array 404 at a first electrode and the preamplifier circuitry 402 on a second electrode. The column selection circuitry 410 includes a column selection device 414 coupled to the memory array 406 on a first electrode and the preamplifier circuitry 402 on a second electrode. While the column selection circuitry 408 and the column selection circuitry 410 are illustrated as including a single column selection device 412 and 414, respectively, in some implementations the column selection circuitry 408 and 410 may each include multiple column selection devices and/or other components for selecting bit lines and source lines associated with bit cells of the memory arrays 404 and 406 being accessed.

In the illustrated example, the preamplifier circuitry 402 includes a current mirror 416. The current mirror 416 includes PMOS switch transistor 418 having a first electrode coupled to a first reference voltage 420, a second electrode connected to a first electrode of PMOS mirror transistor 422, and a gate coupled to receive an evaluation voltage 424. The PMOS mirror transistor 422 has a second electrode connected to a first electrode of a PMOS switch transistor 426, to a first electrode of a negative-channel metal oxide semiconductor (NMOS) switch transistor 428 of the preamplifier circuitry 402, and to a first electrode of a PMOS transistor 438 of the preamplifier circuitry 402, a first electrode of a transmission gate 440, and to the comparator and latch components 444. The PMOS mirror transistor 422 also has a gate coupled to receive the offset voltage 432. In some cases, a capacitor 434 may be coupled between the reference voltage 420 and the offset voltage 432. The PMOS switch transistor 426 also has a second current carrying electrode connected to the reference voltage 420 and a gate coupled to receive the enable voltage 436.

The NMOS switch transistor 428 has a second electrode connected to a first electrode of a NMOS follower transistor 430. The NMOS switch transistor 428 also has a gate coupled to receive a control voltage 442. The PMOS transistor 438 has a second electrode connected to the reference voltage 420 and a gate connected to the comparator and latch components 444. The transmission gate 440 also has a second electrode connected the comparator and latch components 444, and a first gate to receive a first timing control voltage 446 and a second gate to receive a second timing control voltage 448. A capacitor 450 may be coupled between the gate of the PMOS transistor 438 and the reference voltage 420.

The NMOS-follower transistor 430 has a second electrode connected to the first electrode of column selection device 412 and to the first electrode of the column selection device 414. The NMOS-follower transistor 430 also has a gate coupled to a voltage source 452 to receive a second voltage reference 454. A capacitor 456 may be coupled between the gate of transistor 430 and the voltage source 452 to enable and disable the NMOS-follower transistor 430.

For example, a memory device 400 may be implementing self-referenced reads, which causes each bit cell of the memory arrays 404 and 406 to be written to the low resistive state in response to a read access. In this example, when a read operation is performed on memory array 404, the enable voltage 436 and the control voltage 442 transition from a first state to a second state (e.g., from low to high voltage levels) disabling the PMOS switch transistor 426 and enabling the NMOS switch transistor 428. The transitioning of the enable voltage 436 and the control voltage 442 enables the preamplifier circuitry 402 which applies a first predetermined read voltage based on the second voltage reference 454 to the bit lines selected by the column selection circuitry 408. For example, the column selection device 412 may be enabled by a control voltage 462. At the same time, both read PMOS-follower 474 and 476 provide a second predetermined read voltage to the source lines of the memory array 404.

After applying the first predetermined read voltage, the enable voltage 436 and the control voltage 442 transition back to the second state (e.g., to low voltage levels). The falling value of the control voltage 442, in part, terminates the application of first predetermined read voltage to the bit line, while the read PMOS-follower 474 and 476 terminates the second predetermined read voltage on the source line. At substantially the same time, the first timing control voltage 446 and the second timing control voltage 448 cause the transmission gate 440 to isolate the charged capacitor 450, which stores a sample voltage 458 generated based at least in part on the application of the first and second predetermined read voltages.

Write PMOS-follower 466 and 468 may apply a first predetermined write voltage to the source lines through a source line selection circuitry (not shown), while a second predetermined write voltage may be applied to the bit lines selected by the column selection circuitry 408. For instance, in the illustrated example, a write NMOS-follower circuit 472 may be coupled between the first electrode of the NMOS-follower transistor 430 and the first electrode of the column selection device 412 and may be configured to generate the second predetermined write voltage. In general, the write voltages associated with self-referenced reads are initiated to cause each of the bit cells of the memory array 404 to be set to a predetermined resistive state (e.g., the low resistive state in this example).

Next, the write voltages applied to the bit line and source line are terminated, while the read voltage applications are reinitiated by the read PMOS-follower 474 and 476 and the preamplifier circuitry 402, as a result of the control voltage 442 transitioning back to high voltage levels. Subsequently, the evaluation voltage 424 transitions from a high to a low level to enable the PMOS switch transistor 418 that further allows the PMOS-mirror transistor 422 to add a programmable offset current generated by a bias circuit (not shown) to node 460. The coupling of the programmable offset current to the reference voltage 420 through the capacitor 434 increases the power supply noise rejection of the PMOS-mirror transistor 422. Subsequently, the comparator and latch components 444 that senses the difference between sample voltage 458 (e.g., the voltage stored on capacitor 450) and evaluation voltage 460 (e.g., the voltages current at the node 460) and outputs the difference as a digital voltage or data 480 (e.g., zeros or ones).

Similarly, when a read operation is performed on the memory array 406, the enable voltage 436 and the control voltage 442 transition from a first state to a second state (e.g., from low to high voltage levels) disabling the PMOS switch transistor 426 and enabling the NMOS switch transistor 428. The transitioning of the enable voltage 436 and the control voltage 442 enables the preamplifier circuitry 402 that applies a first predetermined read voltage based on the second voltage reference 454 to the bit lines selected by the column selection circuitry 410. For example, the column selection device 414 may be enabled by a control voltage 464. At the same time, the read PMOS-follower circuitry 476 and 478 provide a second predetermined read voltage to the source lines of the memory array 406.

After applying the first predetermined read voltage, the enable voltage 436 and the control voltage 442 transition back to the second state (e.g., to low voltage levels). The falling transitions of the control voltage 442, in part, terminates the application of a first predetermined read voltage to the bit line, while the read PMOS-follower circuitry 476 and 478 terminates the second predetermined read voltage on the source line. At substantially the same time, the first timing control voltage 446 and the second timing control voltage 448 cause the transmission gate 440 to isolate the charged capacitor 450, which stores a sample voltage 458 generated based at least in part on the application of the first and second predetermined read voltages.

Write PMOS-follower circuitry 468 and 470 applies a first predetermined write voltage to the source lines through source line selection circuitry (not shown), while a second predetermined write voltage may be applied to the bit lines selected by the column selection circuitry 410. For instance, in the illustrated example, the write NMOS-follower circuit 472 may be coupled between the first electrode of the NMOS-follower transistor 430 and the first electrode of the column selection device 412 and may be configured to generate the second predetermined write voltage. In general, the write voltages associated with self-referenced reads are initiated to cause each of the bit cells of the memory array 406 to be set to a predetermined resistive state (e.g., the low resistive state in this example).

Next, the write voltages applied to the bit line and source line are terminated, while the read voltage applications are reinitiated by the read PMOS-follower 476 and 478 and the preamplifier circuitry 402, as a result of the control voltage 442 transitioning back to high voltage levels. Subsequently, the evaluation voltage 424 transitions from a high to a low voltage level to enable the PMOS switch transistor 418 that further allows the PMOS-mirror transistor 422 to add a programmable offset current generated by a bias circuit (not shown) to node 482. The coupling of the programmable offset current to the reference voltage 420 through the capacitor 434 increases the power supply noise rejection of the PMOS-mirror transistor 422. Subsequently, the comparator and latch components 444 that senses the difference between sample voltage 458 (e.g., the voltage stored on capacitor 450) and evaluation voltage 460 (e.g., the voltages current at the node 482) outputs the difference as a digital signal or value (e.g., zero or one).

Figure 5:
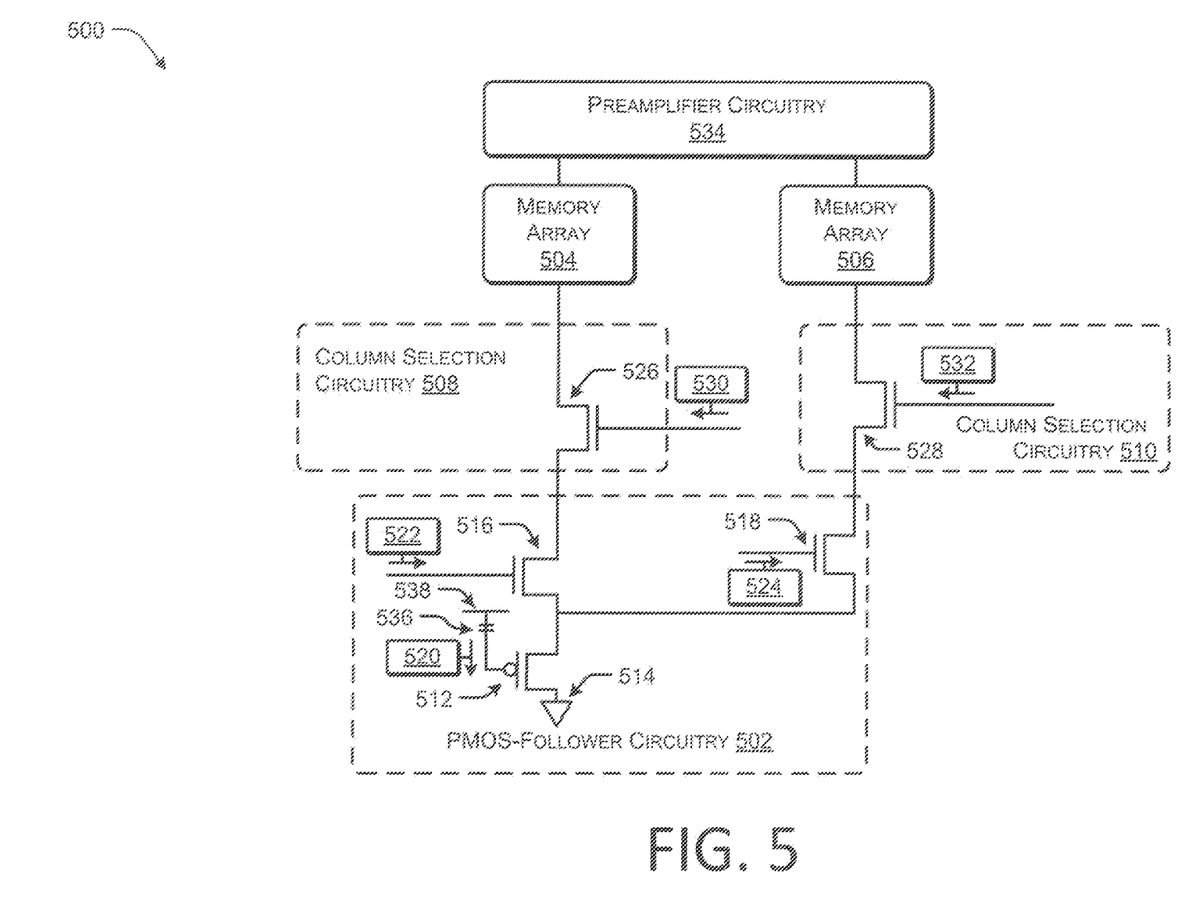
FIG. 5 illustrates a diagram of an example memory device incorporating PMOS-follower circuitry according to some implementations.

FIG. 5 illustrates a diagram of an example memory device 500 incorporating PMOS-follower circuitry 502, such as a PMOS-follower circuitry according to some implementations. In the illustrated example, the PMOS-follower circuitry 502 may be coupled to a first memory array 504 and a second memory array 506. For example, the memory array 504 may be coupled to the PMOS-follower circuitry 502 via first column selection circuitry 508 and the memory array 506 may be coupled to the PMOS-follower circuitry 502 via second column selection circuitry 510.

In general, the PMOS-follower circuitry 502 includes a PMOS follower transistor 512 having a first electrode coupled to a voltage source 514, a second electrode coupled to a first electrode of a NMOS switch transistor 516 and a first electrode of a NMOS switch transistor 518, and a gate coupled to a bias voltage 520. For example, the PMOS-follower circuitry 502 may include a capacitor 536 coupled between a reference voltage 538 and the gate of the PMOS follower transistor 512. The NMOS switch transistor 516 has a second electrode coupled to the column selection circuitry 508 and a gate configured to receive a control voltage 522. Likewise, the NMOS switch transistor 518 has a second electrode coupled to the column selection circuitry 510 and a gate configured to receive a control voltage 524.

For instance, in the illustrated example, the column selection circuitry 508 may be shown as including a column selection device 526 and the column selection circuitry 510 may be shown as including a column selection device 528, such as an NMOS transistor. In this example, the second electrode of the NMOS switch transistor 516 may be shown coupled to a first electrode of the column selection device 526 and the second electrode of the NMOS switch transistor 518 may be shown coupled to a first electrode of the column selection device 528.

The column selection device 526 also has a second electrode coupled to a source line of the memory array 504 and a gate for receiving a control voltage 530. The column selection device 528 also has a second electrode coupled to a source line of the memory array 506 and a gate for receiving a control voltage 532. In the illustrated example, the column selection circuitry 508 is shown with a single column selection device 526 and the column selection circuitry 510 may be shown with a single column selection device 528. However, it should be understood, that each of the column selection circuits 508 and 510 may include a plurality of column selection devices for coupling and de-coupling particular source lines of the memory arrays 504 and 506 to and from the PMOS-follower circuitry 502.

In one example, the memory device 500 may be reading data from memory array 504. In this example, the control voltage 524 is driven low to disable the NMOS switch transistor 518, while the control voltage 522 may be driven high to enable the NMOS switch transistor 516. In this manner, the PMOS-follower circuitry 502 provides a first predetermined read voltage, based on the magnitudes of voltage source 514 and bias voltage 520, to source lines of the memory array 504 selected by the column selection circuitry 508. At substantially the same time, the preamplifier circuitry 534 samples a return voltage on selected bit lines of the memory array 504 in order to read the data from the memory array 504 and output the data to a cache (not shown).

On the other hand, the memory device 500 may be reading data from memory array 506. In this example, the control voltage 522 is driven low to disable the NMOS switch transistor 516, while the control voltage 524 may be driven high to enable the NMOS switch transistor 518. In this manner, the PMOS-follower circuitry 502 provides a first predetermined read voltage, based on the magnitudes of voltage source 514 and bias voltage 520, to source lines of the memory array 506 selected by the column selection circuitry 510. At substantially the same time, the preamplifier circuitry 534 samples a return voltage on selected bit lines of the memory array 506 in order to read the data from the memory array 506 and output the data to a cache (not shown).

FIG. 5 provides one example configuration for the PMOS-follower circuitry. However, other configurations may be implemented. For example, FIG. 6 provides a second example configuration of PMOS-follower circuitry according to some implementations.

Figure 6:
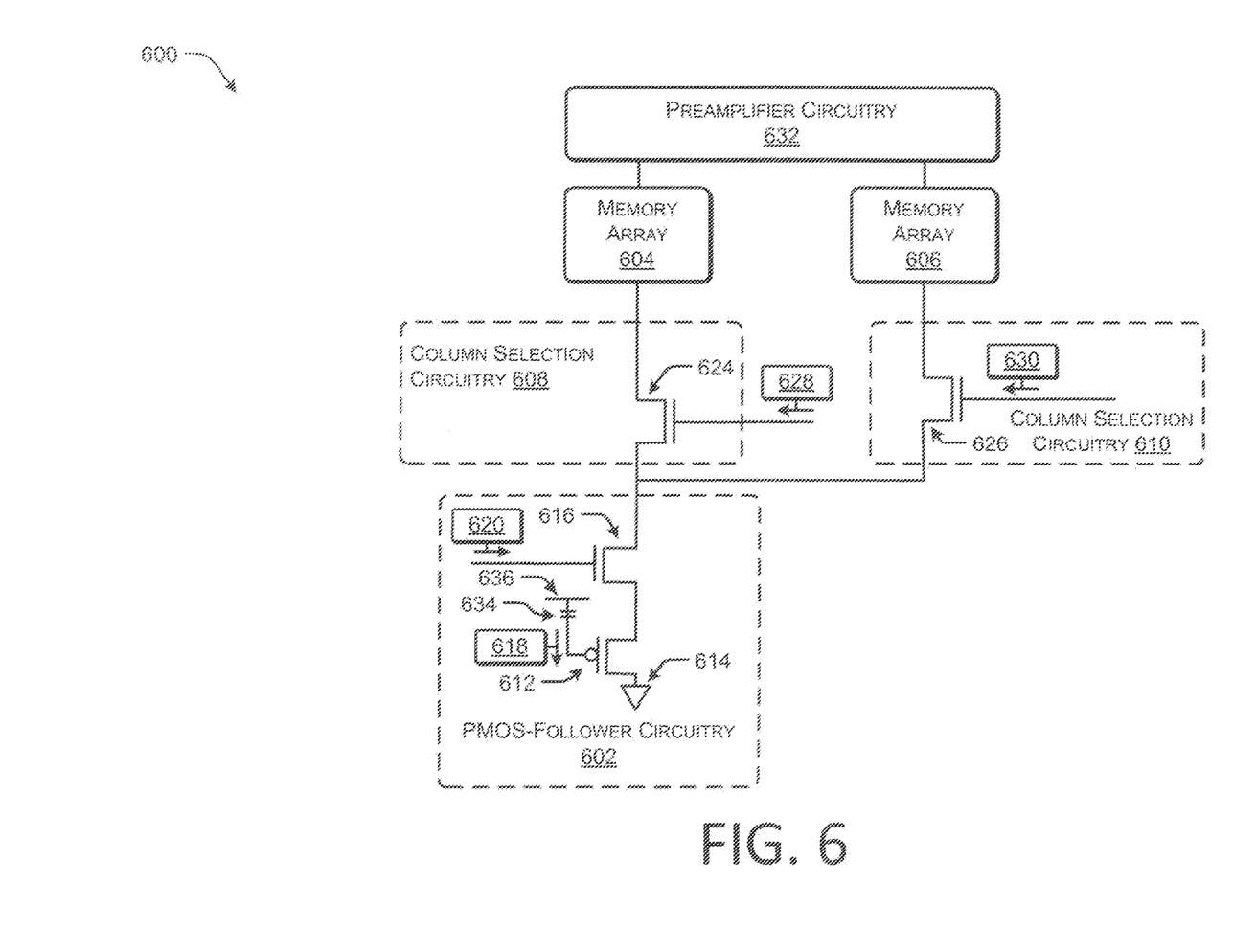
FIG. 6 illustrates a diagram of an example memory device incorporating PMOS-follower circuitry according to some implementations.

FIG. 6 illustrates a diagram of an example memory device 600 incorporating PMOS-follower circuitry 602 according to some implementations. In the illustrated example, the PMOS-follower circuitry 602 may be coupled to a memory array 604 and a memory array 606. For example, the memory array 604 may be coupled to the PMOS-follower circuitry 602 via a first column selection circuitry 608 and the memory array 606 may be coupled to the PMOS-follower circuitry 602 via a second column selection circuitry 610.

In general, the PMOS-follower circuitry 602 includes a PMOS follower transistor 612 having a first electrode coupled to a voltage source 614, a second electrode coupled to a first electrode of a NMOS switch transistor 616, and a gate to receive a bias voltage 618. For example, the PMOS-follower circuitry 602 may include a capacitor 634 coupled between a reference voltage 636 and the gate of the PMOS follower transistor 612. The NMOS switch transistor 616 has a second electrode coupled to the column selection circuitry 608 and to the column selection circuitry 610, and a gate configured to receive a control voltage 620.

For instance, in the illustrated example, the column selection circuitry 608 may be shown as including a column selection device 624 and the column selection circuitry 610 may be shown as including a column selection device 626. In this example, the second electrode of the NMOS switch transistor 616 may be shown coupled to a first electrode of the column selection device 624 and to a first electrode of the column selection device 626.

The column selection device 624 also has a second electrode coupled to a source line of the memory array 604 and a gate for receiving a control voltage 628. The column selection device 626 also has a second electrode coupled to a source line of the memory array 606 and a gate for receiving a control voltage 630. In the illustrated example, the column selection circuitry 608 may be shown with a single column selection device 624 and the column selection circuitry 610 may be shown with a single column selection device 626. However, it should be understood, that each of the column selection circuits 608 and 610 may include a plurality of column selection devices for coupling and de-coupling particular source lines of the memory arrays 604 and 606 to and from the PMOS-follower circuitry 602.

In one example, the memory device 600 may be reading data from memory array 604. In this example, the control voltage 620 may be driven high to enable the NMOS switch transistor 616. Additionally, the control voltage 628 may be driven high to enable the column selection device 624 and the control voltage 630 may be driven low to disable the column selection device 626. In this manner, the PMOS-follower circuitry 602 provides a first predetermined read voltage, based on the magnitudes of voltage source 614 and bias voltage 618, to source lines of the memory array 604 selected by the column selection circuitry 608. At substantially the same time, the preamplifier circuitry 632 samples a return voltage on selected bit lines of the memory array 604 in order to read the data from the memory array 604 and output the data to a cache (not shown).

On the other hand, the memory device 600 may be reading data from memory array 606. In this example, the control voltage 620 may be driven high to enable the NMOS switch transistor 616. Additionally, the control voltage 630 may be driven high to enable the column selection device 626 and the control voltage 628 may be driven low to disable the column selection device 624. In this manner, the PMOS-follower circuitry 602 provides a first predetermined read voltage, based on the magnitude of voltage source 614 and bias voltage 618, to source lines of the memory array 606 selected by the column selection circuitry 610. At substantially the same time, the preamplifier circuitry 632 samples a return voltage on selected bit lines of the memory array 606 in order to read the data from the memory array 606 and output the data to a cache (not shown).

Although the subject matter has been described in language specific to structural features, it may be to be understood that the subject matter defined in the appended claims may be not necessarily limited to the specific features described. For example, in alternate embodiments, source line associated with a selected column of bit cells may comprise of a plurality of other bit cells and their bit lines on the selected row. Rather, the specific features are disclosed as illustrative forms of implementing the claims.

What is claimed is:

1. A memory device comprising:
   a first memory array and a second memory array for storing data associated with the memory device, the first memory array having a first plurality of bit cells and the second memory array having a second plurality of bit cells;
   a third memory array and a fourth memory array for storing data associated with the memory device, the third memory array having a third plurality of bit cells and the fourth memory array having a fourth plurality of bit cells;
   first PMOS-follower circuitry coupled to the first plurality of bit cells of the first memory array;
   second PMOS-follower circuitry coupled to the first plurality of bit cells of the first memory array and to the second plurality of bit cells of the second memory array;
   third PMOS-follower circuitry coupled to the second plurality of bit cells of the second memory array and to the third plurality of bit cells of the third memory array;
   fourth PMOS-follower circuitry coupled to the third plurality of bit cells of the third memory array and to the fourth plurality of bit cells of the fourth memory array;
   fifth PMOS-follower circuitry coupled to the fourth plurality of bit cells of the fourth memory array;
   first column selection circuitry coupled between the first PMOS-follower circuitry and the first plurality of bit cells;
   second column selection circuitry coupled between the second PMOS-follower circuitry and the first plurality of bit cells;
   third column selection circuitry coupled between the second PMOS-follower circuitry and the second plurality of bit cells;
   fourth column selection circuitry coupled between the third PMOS-follower circuitry and the second plurality of bit cells;
   fifth column selection circuitry coupled between the third PMOS-follower circuitry and the third plurality of bit cells;
   sixth column selection circuitry coupled between the fourth PMOS-follower circuitry and the third plurality of bit cells;
   seventh column selection circuitry coupled between the fourth PMOS-follower circuitry and the fourth plurality of bit cells;
   eighth column selection circuitry coupled between the fifth PMOS-follower circuitry and the fourth plurality of bit cells; and
   a preamplifier circuit configured to read data from each of the first plurality of bit cells of the first memory array, the second plurality of bit cells of the second memory array, the third plurality of bit cells of the third memory array, and the fourth plurality of bit cells of the fourth memory array.

2. The memory device as recited in claim 1, further comprising NMOS-follower circuitry coupled to the preamplifier circuit.

3. The memory device as recited in claim 1, wherein the first plurality of bit cells, the second plurality of bit cells, the third plurality of bit cells, and the fourth plurality of bit cells are coupled to the preamplifier circuit by a plurality of lines.

4. The memory device as recited in claim 3, wherein the plurality of lines are bit lines.

5. The memory device as recited in claim 1, wherein:
   the first plurality of bit cells are coupled to the first PMOS-follower circuitry by a first plurality of lines.

6. The memory device as recited in claim 5, wherein the first plurality of lines are source lines.

7. The memory device as recited in claim 1, wherein the first PMOS-follower circuitry includes read PMOS-follower circuitry and write PMOS-follower circuitry.

8. A memory device comprising:
a first memory array, a second memory array, a third memory array, and a fourth memory array;
first PMOS-follower circuitry for driving a first read voltage and a first write voltage along source lines associated with a first plurality of bit cells of the first memory array;
second PMOS-follower circuitry for driving a second read voltage and a second write voltage along source lines associated with a second plurality of bit cells of the first memory array and a first plurality of bit cells of the second memory array;
third PMOS-follower circuitry for driving a third read voltage and a third write voltage along source lines associated with a second plurality of bit cells of the second memory array and a first plurality of bit cells of the third memory array;
fourth PMOS-follower circuitry for driving a fourth read voltage and a fourth write voltage along source lines associated with a second plurality of bit cells of the third memory array and a first plurality of bit cells of the fourth memory array;
fifth PMOS-follower circuitry for driving a fifth read voltage and a fifth write voltage along source lines associated with a second plurality of bit cells of the fourth memory array;
first column selection circuitry coupled between the first PMOS-follower circuitry and the first plurality of bit cells of the first memory array;
second column selection circuitry coupled between the second PMOS-follower circuitry and the second plurality of bit cells of the first memory array;
third column selection circuitry coupled between the second PMOS-follower circuitry and the first plurality of bit cells of the second memory array;
fourth column selection circuitry coupled between the third PMOS-follower circuitry and the second plurality of bit cells of the second memory array;
fifth column selection circuitry coupled between the third PMOS-follower circuitry and the first plurality of bit cells of the third memory array;
sixth column selection circuitry coupled between the fourth PMOS-follower circuitry and the second plurality of bit cells of the third memory array;
seventh column selection circuitry coupled between the fourth PMOS-follower circuitry and the first plurality of bit cells of the fourth memory array; and
eighth column selection circuitry coupled between the fifth PMOS-follower circuitry and the second plurality of bit cells of the fourth memory array; and
a preamplifier circuit configured to sample a first return voltage on bit lines associated with the first memory array, a second return voltage on bit lines associated with the second memory array, a third return voltage on bit lines associated with the third memory array, and a fourth return voltage on bit lines associated with the fourth memory array.

9. A memory device comprising:
a first memory array and a second memory array for storing data associated with the memory device;
a third memory array and a fourth memory array for storing data associated with the memory device;
first PMOS-follower circuitry coupled to lines accessible at a first end of the first memory array;
second PMOS-follower circuitry coupled to lines accessible at a second end of the first memory array and a first end of the second memory array;
third PMOS-follower circuitry coupled to lines accessible at a second end of the second memory array and a first end of the third memory array;
fourth PMOS-follower circuitry coupled to lines accessible at a second end of the third memory array and a first end of the fourth memory array;
fifth PMOS-follower circuitry coupled to lines accessible at a second end of the fourth memory array;
first column selection circuitry coupled between the lines accessible at the first end of the first memory array and the first PMOS-follower circuitry;
second column selection circuitry coupled between the lines accessible at the second end of the first memory array and the second PMOS-follower circuitry;
third column selection circuitry coupled between the lines accessible at the first end of the second memory array and the second PMOS-follower circuitry;
fourth column selection circuitry coupled between the lines accessible at the second end of the second memory array and the third PMOS-follower circuitry;
fifth column selection circuitry coupled between the lines accessible at the first end of the third memory array and the third PMOS-follower circuitry;
sixth column selection circuitry coupled between the lines accessible at the second end of the third memory array and the fourth PMOS-follower circuitry;
seventh column selection circuitry coupled between the lines accessible at the first end of the fourth memory array and the fourth PMOS-follower circuitry;
eighth column selection circuitry coupled between the lines accessible at the second end of the fourth memory array and the fifth PMOS-follower circuitry; and
a preamplifier circuit coupled to the lines of the first memory array, the lines of the second memory array, the lines of the third memory array, and the lines of the fourth memory array, wherein the preamplifier circuit is configured to read data from each of the first memory array, the second memory array, the third memory array, and the fourth memory array.

10. The memory device as recited in claim 9, wherein:
each of the first memory array, the second memory array, the third memory array, and the fourth memory array is coupled to bit lines and source lines;
the second PMOS-follower circuitry is coupled to the source lines of the first memory array and the source lines of the second memory array;
the third PMOS-follower circuitry is coupled to the source lines of the second memory array and the source lines of the third memory array;
the fourth PMOS-follower circuitry is coupled to the source lines of the third memory array and the source lines of the fourth memory array; and
the preamplifier circuitry is coupled to the bit lines of the first memory array, the bit lines of the second memory array, the bit lines of third memory array, and the bit lines of the fourth memory array.

11. The memory device as recited in claim 9, wherein the second PMOS-follower circuitry is configured to drive read voltages and write voltages to a portion of bit cells of the first memory array and a portion of bit cells of the second memory array.

12. The memory device as recited in claim 9, further comprising a comparator and latch component coupled to the preamplifier circuit for receiving voltages and outputting a digital signal.

\* \* \* \* \*